(12) United States Patent
Kowalsky et al.

(10) Patent No.: US 11,769,839 B2
(45) Date of Patent: Sep. 26, 2023

(54) STACKED III-V SEMICONDUCTOR DIODE

(71) Applicant: 3-5 Power Electronics GmbH, Dresden (DE)

(72) Inventors: Jens Kowalsky, Storkow (DE); Volker Dudek, Ettlingen (DE); Riteshkumar Bhojani, Chemnitz (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 17/667,316

(22) Filed: Feb. 8, 2022

(65) Prior Publication Data

US 2022/0254937 A1 Aug. 11, 2022

(30) Foreign Application Priority Data

Feb. 8, 2021 (DE) ...................... 10 2021 000 609.7

(51) Int. Cl.
*H01L 29/868* (2006.01)
*H01L 29/861* (2006.01)
(Continued)

(52) U.S. Cl.
CPC ............ *H01L 29/861* (2013.01); *H01L 29/06* (2013.01); *H01L 29/20* (2013.01); *H01L 29/66204* (2013.01)

(58) Field of Classification Search
CPC ....... H01L 29/861; H01L 29/06; H01L 29/20; H01L 29/66204; H01L 29/8613;
(Continued)

(56) References Cited

U.S. PATENT DOCUMENTS

| 10,186,587 B2 | 1/2019 | Kuenle et al. |
| 10,529,809 B2 | 1/2020 | Kuenle et al. |

(Continued)

FOREIGN PATENT DOCUMENTS

| CN | 103178120 A | 6/2013 |
| DE | 10 2011 006 675 A1 | 10/2012 |

(Continued)

OTHER PUBLICATIONS

Koel et al; "Characterization of the temperature dependent behavior of snappy phenomenon by the switching-off of GaA's power diode structures"; pp. 439-449, Jul. 1, 2014; DOI 10.2495/HT140381.

(Continued)

*Primary Examiner* — Shahed Ahmed
(74) *Attorney, Agent, or Firm* — Muncy, Geissler, Olds & Lowe, P.C.

(57) ABSTRACT

A stacked III-V semiconductor diode comprising or consisting of GaAs with a highly n-doped cathode layer, a highly p-doped anode layer and a drift region arranged between the cathode layer and the anode layer, wherein the drift region has a low n-doped drift layer and a low p-doped drift layer, the n-doped drift layer is arranged between the p-doped drift layer and the cathode layer, both drift layers each have a layer thickness of at least 5 μm and, along the respective layer thickness, have a dopant concentration maximum of not more than $8 \cdot 10^{15}$ cm$^{-3}$, the dopant concentration maxima of the two drift layers have a ratio of 0.1 to 10 to each other and a ratio of the layer thickness of the n-doped drift layer to the layer thickness of the p-doped drift layer is between 0.5 and 3.

15 Claims, 2 Drawing Sheets

(51) Int. Cl.
    *H01L 29/06*     (2006.01)
    *H01L 29/20*     (2006.01)
    *H01L 29/66*     (2006.01)

(58) Field of Classification Search
    CPC ....... H01L 29/0684; H01L 2924/12031; H01L 29/868; H01L 29/36–365
    See application file for complete search history.

(56) References Cited

U.S. PATENT DOCUMENTS

| | | |
|---|---|---|
| 10,854,760 B2 | 12/2020 | Dudek |
| 2017/0373157 A1 | 12/2017 | Kuenle et al. |
| 2018/0138043 A1 | 5/2018 | Dudek |
| 2018/0138320 A1 | 5/2018 | Dudek |
| 2018/0277687 A1 | 9/2018 | Dudek |
| 2019/0198621 A1 | 6/2019 | Lutz et al. |
| 2019/0198625 A1* | 6/2019 | Dudek ................ H01L 29/207 |
| 2019/0221676 A1 | 7/2019 | Dudek |
| 2019/0326446 A1 | 10/2019 | Dudek |

FOREIGN PATENT DOCUMENTS

| | | | |
|---|---|---|---|
| DE | 10 2016 111 844 A1 | 12/2017 | |
| DE | 102016111844 A1 | 12/2017 | |
| DE | 10 2018 000 395 A1 | 7/2019 | |
| DE | 102018000395 A1 | 7/2019 | |
| EP | 0 614 231 A2 | 9/1994 | |
| EP | 0614231 A2 | 9/1994 | |
| EP | 3379581 A1 * | 9/2018 | ........... H01L 21/187 |
| EP | 3 321 971 B1 | 10/2019 | |
| EP | 3 321 970 B1 | 2/2020 | |
| JP | H 06-314801 A | 11/1994 | |
| JP | 2019-125788 A | 7/2019 | |
| WO | WO 2011/024214 A1 | 3/2011 | |

OTHER PUBLICATIONS

German Ashkinazi, GaAs Power Devices, ISBN 965-7094-19-4, pp. 8-9 (1999).

* cited by examiner

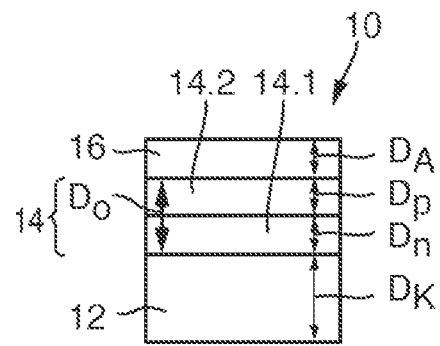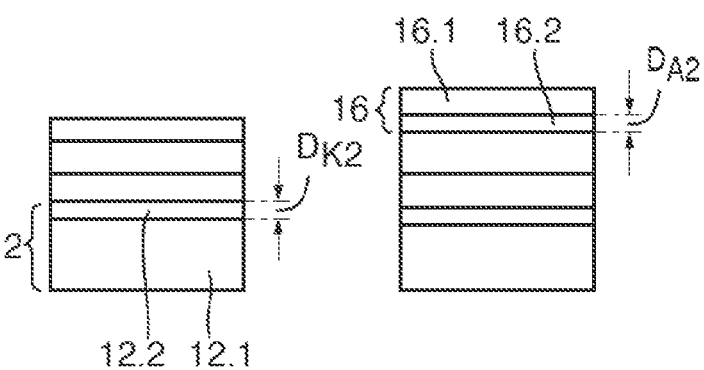
Fig. 1　　　　Fig. 2　　　　Fig. 3
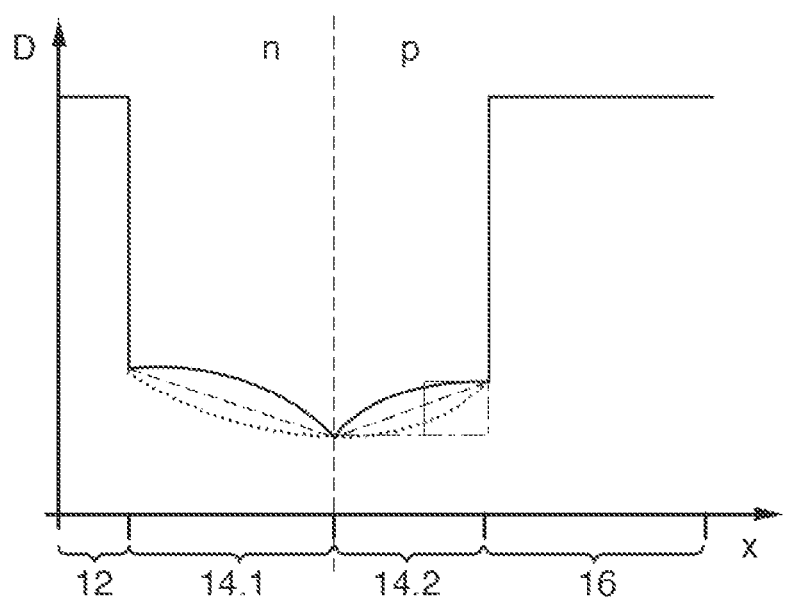
Fig. 4

STACKED III-V SEMICONDUCTOR DIODE

This nonprovisional application claims priority under 35 U.S.C. § 119(a) to German Patent Application No. 10 2021 000 609.7, which was filed in Germany on Feb. 8, 2021, and which is herein incorporated by reference.

BACKGROUND OF THE INVENTION

Field of the Invention

The present invention relates to a stacked III-V semiconductor diode comprising or consisting of GaAs, having a highly n-doped cathode layer, a highly p-doped anode layer and a drift region arranged between the cathode layer and the anode layer.

Description of the Background Art

A high-voltage resistant semiconductor diode with a p+-n-n+ structure made of gallium arsenide is known from "GaAs Power Devices" by German Ashkinazi, ISBN 965-7094-19-4, pages 8 and 9.

Further stacked III-V semiconductor diodes are known from EP 3 321 971 B1, which corresponds to US 2018/0138320, and from EP 3 321 970 B1, which corresponds to US 2018/138043, which are all herein incorporated by reference, wherein the semiconductor diodes have an additional intermediate layer between the drift region and the cathode or anode.

Further semiconductor devices are known from DE 10 2016 111 844 A1 (which corresponds to US 2017/0373157), JP H06-314 801A and DE 10 2018 000 395 A1 (which corresponds to US 2019/0221676 and is incorporated herein by reference).

SUMMARY OF THE INVENTION

It is therefore an object of the present invention to provide a device that further develops the prior art.

In an exemplary embodiment of the invention, a stacked III-V semiconductor diode is provided comprising or consisting of GaAs, having a highly n-doped cathode layer, a highly p-doped anode layer and a drift region arranged between the cathode layer and the anode layer.

The drift region has a low n-doped drift layer and a low p-doped drift layer, wherein the n-doped drift layer is arranged between the p-doped drift layer and the cathode layer.

Both drift layers each have a layer thickness of at least 5 µm and, along the respective layer thickness, a dopant concentration maximum of not more than $8·10^{15}$ cm$^{-3}$.

The dopant concentration maxima of the two drift layers to each other have a ratio of 0.1 to 10.

The ratio of the layer thickness of the n-doped drift layer to the layer thickness of the p-doped drift layer is between 0.5 and 3.

It is understood that all semiconductor layers of a semiconductor diode consisting of GaAs or comprising GaAs, in particular the cathode layer, the anode layer and the drift region, each consist of GaAs or at least comprise GaAs.

In other words, each semiconductor layer of the III-V semiconductor diode has at least the elements Ga and As.

The semiconductor layers can be produced by epitaxy. In a further development, the cathode layer or the anode layer can be formed by a substrate layer. Preferably, further III-V semiconductor layers are epitaxially grown on the substrate layer to form the III-V semiconductor diode.

Alternatively, the III-V semiconductor diode comprises at least one semiconductor bond. Here, surfaces of two GaAs semiconductor discs or GaAs wafers are joined together.

The doping of the respective GaAs semiconductor layers can be introduced during epitaxy. Preferably, epitaxy is performed by means of MOVPE and/or LPE.

Doping can also be carried out by means of ion implantation after epitaxial growth or, alternatively, instead of being introduced during epitaxy.

In addition, the semiconductor diode can have further layers of other materials, in particular metallic connection contact layers. The connection contact layers are formed, for example, completely or partially of a metal, e.g., gold, or of a metal alloy and are generated, for example, by electron beam evaporation or by sputtering.

At least the area of the cathode layer and the anode layer adjacent to a connection contact layer preferably has a high dopant concentration in order to form the lowest possible low impedance contact and to keep the series resistance or the power dissipation of the semiconductor diode as low as possible.

The drift region is characterized by a total width of at least 10 µm. The total width can be at least 20 µm or at least 40 µm or at least 60 µm. The total width is divided into a weakly p-doped and a weakly n-doped region or layer.

The ratio of the layer thicknesses of the two drift layers is chosen such that the n-doped drift layer is at least half as thick as the p-doped drift layer or that the n-doped drift layer is at most three times as thick as the p-doped drift layer.

The respective dopant concentration of the two drift layers is as low as possible in a region adjacent to the other drift layer and, if necessary, ascends slightly in a direction pointing away from the other drift layer. In a further development, the ascension occurs in one or more steps.

The p-n junction thus forms within the drift region and in an area with very low dopant concentrations.

Due to the wide drift region formed of two differently low doped layers, diodes with particularly high reverse voltages of over 1100 V or even over 1200 V can be achieved and produced with small switch-on resistors and particularly low capacitances per area.

In a further development, isoelectric or isovalent centers are incorporated into the p-doped drift layer and/or the anode layer in order to increase the switching speed, i.e., the change between backward and forward direction. Here, the isoelectric or isovalent centers represent impurity complexes. The impurity complexes are energetically deep-lying and significantly reduce the charge carrier life, i.e., the centers empty the charge carriers, especially in reverse operation.

In one embodiment, the isoelectric centers include N and/or Zn-0 and/or Mn and/or an element from the III and/or an element from the V main group.

In another further development, the concentration of the isoelectric centers is in a range between $5·10^{11}$ cm$^{-3}$ and $8·10^{14}$ cm$^{-3}$ or in a range between $5·10^{12}$ cm$^{-3}$ and $1·10^{14}$ cm$^{-3}$ or in a range between $1·10^{13}$ cm$^{-3}$ and $8·10^{13}$ cm$^{-3}$. Preferably, the concentration of the isoelectric centers is below the dopant concentration of the respective area of the drift layer or the anode layer by a factor of 1000 up to a factor of 10 or by a factor of 100 up to a factor of 20.

In particular, GaAs power diodes can be produced with a reverse recovery charge of no more than 80 nC per 1 mm diode area.

The layer thickness of the n-doped drift layer can be greater than the layer thickness of the p-doped drift layer. The n-doped drift layer and/or the p-doped drift layer can have a layer thickness of at least 20 µm or at least 40 µm. The particularly high layer thickness of both drift layers makes it possible in particular to improve the dielectric strength of the diode.

The n-doped drift layer can have an ascending dopant concentration curve along the layer thickness in the direction of the cathode layer up to the dopant concentration maximum.

The slow reduction of the dopant concentration of the n-doped drift layer in the direction of the p-doped drift layer makes it possible in particular to achieve very low dopant concentrations and to produce a controlled and reproducible p-n transition.

The p-doped drift layer can have an ascending dopant concentration curve along the layer thickness in the direction of the anode layer up to the dopant concentration maximum. As already explained, the ascension can also occur in a step-like curve.

The ascending dopant concentration curve is linear or concave or convex. For example, a convex rise follows a Gauss curve, a concave rise follows an exponential function, for example. It is understood that the concentration curve is always less than the maximum doping of $8 \cdot 10^{15}$ cm$^{-3}$.

The dopant concentration curve of the n-doped drift layer and/or the p-doped drift layer can have one or more steps along the layer thickness. One or more steps or each step has a convex flank or a concave flank or a linear flank in alternative further developments.

The dopant concentration curve of the two drift layers may each drop in the direction of the other drift layer to a value less than $3 \cdot 10^{15}$ cm$^{-3}$ or less than $6 \cdot 10^{14}$ cm$^{-3}$ or less than $3 \cdot 10^{14}$ cm$^{-3}$ or less than $2 \cdot 10^{14}$ cm$^{-3}$.

The dopant concentration along at least 80% thickness of the n-doped drift layer and/or the p-doped drift layer can be greater than $5 \cdot 10^{13}$ cm$^{-3}$.

The cathode layer can have a dopant concentration of at least $1 \cdot 10^{18}$ cm$^{-3}$ or at least $5 \cdot 10^{18}$ cm$^{-3}$ or at least $8 \cdot 10^{18}$ cm$^{-3}$.

The anode layer can have a dopant concentration of at least $1 \cdot 10^{17}$ cm$^{-3}$ or at least $5 \cdot 10^{17}$ cm$^{-3}$ or at least $8 \cdot 10^{18}$ cm$^{-3}$. The low doping makes it possible to improve the switch-off behavior of the diode and to reduce the recovery charge.

It is understood that in particular in an area of the cathode and anode layer adjacent to the metallic connection contacts, the highest possible dopant concentration is sought in order to keep the series resistance of the diode as low as possible or to establish a low impedance contact.

The cathode layer and/or the anode layer can have a layer thickness of at least 2 µm or at least 5 µm or at least 20 µm. A low layer thickness made it easier to keep the series resistance of the diode low.

The cathode layer and/or the anode layer can comprise a first section with a constant dopant concentration curve and a second section arranged between the first section and the drift region with a dopant concentration curve which ascends in a linear and/or concave and/or step-like manner in the direction of the first section. Preferably, the stepped dopant concentration area comprises or consists of one step or two steps or three steps.

In particular, the second layer section makes it possible to shape the transition of the dopant concentration from the low level in the area of the drift region to a significantly higher level of the second section of the anode and/or cathode layer.

The second layer section can have at least one step or has exactly one step or has at least two or has exactly two steps in the curve of the doping profile.

In a single step at the top of said step, the dopant concentration can be greater than the factor 2 or greater than the factor 5 or greater than the factor 8 than the dopant concentration of the drift layer adjacent to the second region.

By avoiding a sudden transition, i.e., an increase in the dopant concentration of $8 \cdot 10^{15}$ cm$^{-3}$ to the dopant concentration of the first section, by means of a gradual or incremental ascension over a transition area, i.e., the second section, the switch-off behavior of the diode is significantly improved.

The second section can have a layer thickness of at least 0.5 µm and at most 10 µm. Preferably, the second section of the cathode layer has a layer thickness of 3 µm to 5 µm, whereas the second section of the anode layer preferably has a layer thickness of 2 µm to 4 µm.

The cathode layer or the anode layer can be formed as a substrate. Typical layer thicknesses of an anode or cathode layer formed as a substrate are 100 µm to 250 µm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a view of an example of a stacked III-V semiconductor diode,

FIG. 2 is a view of an example of the stacked III-V semiconductor diode,

FIG. 3 is a view of an example of the stacked III-V semiconductor diode,

FIG. 4 is a dopant concentration curve along the stacked III-V semiconductor diode in a further embodiment.

DETAILED DESCRIPTION

Figure 5:
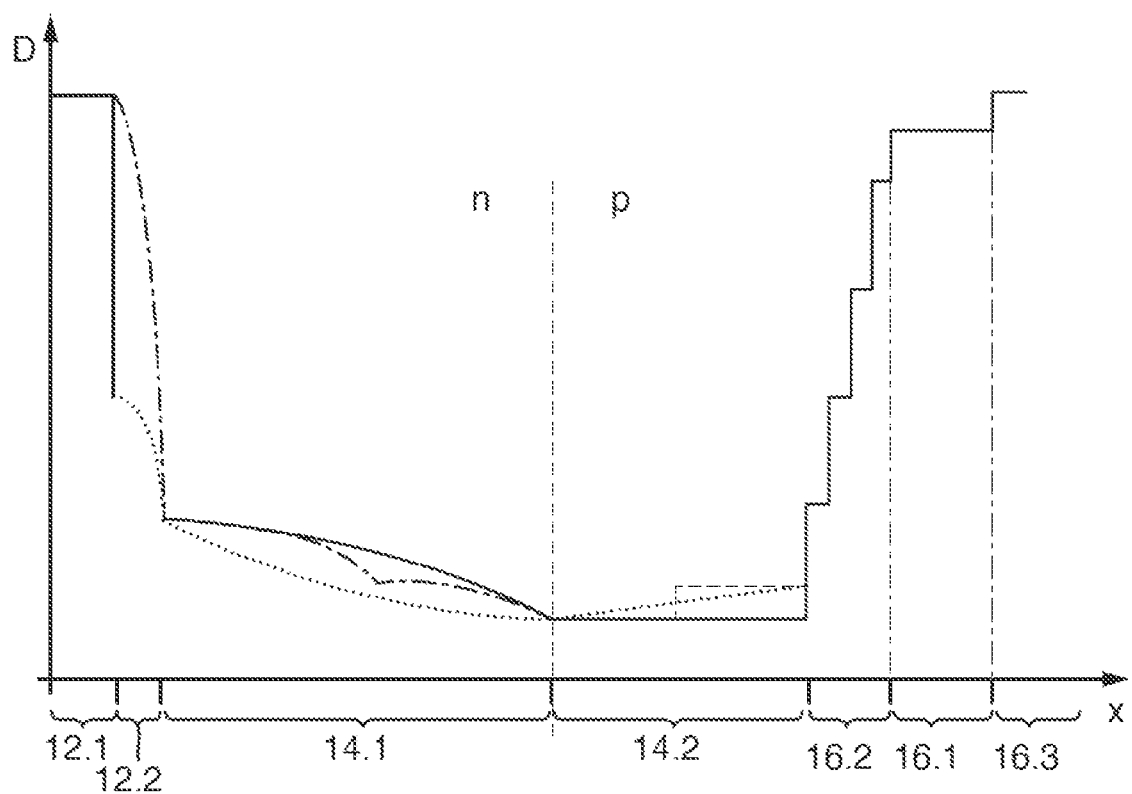
FIG. 5 is an example of the dopant concentration curve along the stacked II-V semiconductor diode.

The illustration of FIG. 1 shows a view of a first embodiment of a stacked III-V semiconductor diode 10 comprising GaAs or consisting of GaAs. A highly n-doped substrate layer forms a cathode layer 12, on which the drift region 14 is arranged with a total thickness $D_D$, followed by a highly p-doped anode layer 16 with a layer thickness $D_A$.

The drift region 14 is divided into a weakly n-doped drift layer 14.1 with a layer thickness $D_n$ adjacent to the cathode layer 12 and a weakly p-doped drift layer 14.2 with a layer thickness $D_p$ arranged between the n-doped drift layer 14.1 and the anode layer 16.

The cathode layer 12 formed by a substrate accordingly has a slightly greater layer thickness DK of 50 µm to 250 µm. A dopant concentration of the cathode layer is preferably at least $8 \cdot 10^{18}$ cm$^{-3}$ and is constant or at least substantially constant along the layer thickness.

The other layers are preferably epitaxially produced on the cathode layer 12. The doping can be generated during epitaxy or subsequently by ion implantation. The layer thickness $D_n$ of the n-doped drift layer 14.1 is at least 5 µm, preferably at least 40 µm. A dopant concentration drops from a dopant concentration maximum of not more than $8 \cdot 10^{15}$ cm$^{-3}$, preferably from a maximum of $2 \cdot 10^{15}$ cm$^{-3}$, in the direction of the p-doped drift layer 14.2.

The layer thickness $D_p$ of the p-doped drift layer 14.2 is at least 5 µm, preferably at least 20 µm. Preferably, the layer thickness $D_p$ of the p-doped drift layer 14.2 is half or one third of the layer thickness $D_n$ of the n-doped drift layer 14.1. A dopant concentration of the p-doped drift layer 14.2 increases in the direction of the anode layer 16 up to a dopant concentration maximum of at least $1 \cdot 10^{17}$ cm$^{-3}$ or at least $1 \cdot 10^{18}$ cm$^{-3}$.

In the illustration of FIG. 2, another embodiment is shown. In the following, only the differences to the illustration in FIG. 1 are explained.

The stacked III-V semiconductor diode 10 has a cathode layer 12 with a first section 12.1 having a constant dopant concentration of at least $1 \cdot 10^{18}$ cm$^{-3}$, preferably of at least $8 \cdot 10^{18}$ cm$^{-3}$ and with a second section 12.2. The second section 12.2 is arranged between the first section 12.1 and the drift region 14 and has a relatively low layer thickness $D_{K2}$ of 0.5 µm to 10 µm, preferably from 3 µm to 5 µm.

The second layer section serves to shape the transition of the dopant concentration from the highly doped first section 12.1 of the cathode layer to the low n-doped drift layer 14.1. The second section 12.2 has for this purpose a dopant concentration curve ascending in the direction of the first section 12.1 from a dopant concentration minimum to a dopant concentration maximum. The dopant concentration curve is linear or concave or convex or stepped with one step or with several steps. In a step-like curve, the flank of one or more steps or of all steps is preferably convex or concave or linearly formed.

In an example, the dopant concentration maximum of the second section 12.2 corresponds to the dopant concentration of the first section 12.1, while the dopant concentration minimum of the second section 12.2 corresponds to the dopant concentration maximum of the n-doped drift region. In other embodiments, a jump in the dopant concentration is formed at the interface between the first and second sections 12.1, 12.2 and/or between the second section 12.2 and the drift region 14, wherein the jump in the dopant concentration, due to the dopant concentration curve of the second section 12.2, is lower than in an embodiment of the semiconductor diode 10 without the second cathode section 12.2.

In the illustration of FIG. 3, another example is shown. In the following, only the differences to FIG. 2 are explained.

The stacked III-V semiconductor diode 10 has an anode layer 16 with a first section 16.1 with a constant dopant concentration of at least $1 \cdot 10^{17}$ cm$^{-3}$ and a second section 16.2 with a dopant concentration profile ascending in the direction of the first section 16.1 and a layer thickness $D_{A2}$ from 0.5 µm to 10 µm, preferably from 2 µm to 4 µm.

Like the second section 12.2 of the cathode layer 12, the second section 16.2 of the anode layer 16 serves to shape the transition of the dopant concentration. The dopant concentration curve of the second section 16.2 is linear or concave or convex or stepped with one or more steps. In a step-like curve, the flank of one or more steps or of all steps is preferably convex or concave or linearly formed.

The stacked III-V semiconductor diode 10 can have the anode layer 16 with the two sections 16.1 and 16.2 and a drift layer 14 described above in the first embodiment of FIG. 1, i.e., without the second section 12.2.

In the illustration of FIG. 4, another example is shown. In the following, only the differences to FIG. 1 are explained.

FIG. 4 shows various dopant concentration curves along the stacked III-V semiconductor diode 10 with a layer sequence corresponding to the embodiment of FIG. 1. In alternative embodiments, the dopant concentration curve of the n-doped drift layer 14.1 proceeds convex or concave or linearly ascending in the direction of the cathode layer 12.

The dopant concentration curve of the p-doped drift layer 14.2 proceeds in the direction of the anode layer 16 in a constant or ascending manner, wherein the ascension is stepped or convex or linear or concave.

The convex rise of the n-doped and/or the p-doped drift layer 14.1 or 14.2 is gauss-shaped.

Alternatively, in an embodiment the concave ascension of the n-doped and/or the p-doped drift layer 14.1 or 14.2 follows an exponential curve.

In the illustration of FIG. 5, another example is shown. In the following, only the differences to the illustration of FIG. 3 are explained.

In FIG. 5, various dopant concentration curves along the stacked III-V semiconductor diode 10 are shown as examples.

The dopant concentration curve begins with a constant, high dopant concentration of n-dopants over the first section 12.1 of the cathode layer 12, followed by a dopant concentration drop over the second section 12.2 of the cathode layer, wherein the drop is convex and begins at the dopant concentration level of the first section 12.2 or at a significantly lower level.

Subsequently, the dopant concentration drops further over the n-doped drift layer 14.1. The drop takes place more slowly and with or without steps.

Between the n-doped drift layer 14.1 and the p-doped drift layer 14.2, a change of the dopant takes place, wherein the p-doped drift layer 14.2 in the embodiment shown has a constant or linearly ascending or stepped concentration of p-dopants.

In the second section 16.2 of the anode layer 16 adjacent to the drift region, the dopant concentration of p-dopants ascends in a step-like manner over several rectangular steps. The subsequent first section 16.1 of the anode layer 16 has a constant dopant concentration level of at least $1 \cdot 10^{17}$ cm$^{-3}$.

In addition, the anode layer 16 has a third section 16.3 following the first section 16.1, so that the first section 16.1 is arranged between the second section 16.2 and the third section 16.3. The third section 16.3 has a higher dopant concentration than the first section 16.1, preferably a constant dopant concentration of at least $5 \cdot 10^{18}$ cm$^{-3}$ or of at least $1 \cdot 10^{19}$ cm$^{-3}$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising or consisting of GaAs, and comprising:
   a highly n-doped cathode layer;
   a highly p-doped anode layer; and
   a drift region arranged between the cathode layer and the anode layer, the drift region having a low n-doped drift layer and a low p-doped drift layer, wherein the n-doped drift layer is arranged between the p-doped drift layer and the cathode layer, wherein both drift layers each have a layer thickness of at least 5 μm and, along the respective layer thickness, a dopant concentration maximum of not more than $8 \cdot 10^{15}$ cm$^{-3}$, wherein the dopant concentration maxima of the two drift layers to each other have a ratio of 0.1 to 10, wherein a ratio of the layer thickness of the n-doped drift layer to the layer thickness of the p-doped drift layer is between 0.5 to 3, and wherein the anode layer and/or the cathode layer has a first section with a constant dopant concentration curve and a second section arranged between the first section and the drift region with a dopant concentration curve ascending in a step-like manner in the direction of the first section.

2. The stacked Ill-V semiconductor diode according to claim 1, wherein the layer thickness of the n-doped drift layer is greater than the layer thickness of the p-doped drift layer.

3. The stacked III-V semiconductor diode according to claim 1, wherein the n-doped drift layer and/or the p-doped drift layer has a layer thickness of at least 20 μm or at least 40 μm.

4. The stacked III-V semiconductor diode according to claim 1, wherein the n-doped drift layer has an ascending dopant concentration curve along the layer thickness in the direction of the cathode layer up to the dopant concentration maximum.

5. The stacked III-V semiconductor diode according to claim 1, wherein the p-doped drift layer has an ascending dopant concentration curve along the layer thickness in the direction of the anode layer up to the dopant concentration maximum.

6. The stacked III-V semiconductor diode according to claim 4, wherein the ascending dopant concentration curve is linear or concave or convex or comprises a plurality of steps.

7. The stacked III-V semiconductor diode according to claim 4, wherein the dopant concentration curve of the n-doped drift layer and/or the p-doped drift layer has one or more steps along the layer thickness.

8. The stacked III-V semiconductor diode according to claim 7, wherein one step or several steps or each step has a convex flank or a concave flank or a linear flank.

9. The stacked Ill-V semiconductor diode according to claim 4, wherein the dopant concentration curve of the two drift layers in the direction of the other drift layer drop to a value less than $9 \cdot 10^{14}$ cm$^{-3}$ or less than $6 \cdot 10^{14}$ cm$^{-3}$ or less than $3 \cdot 10^{14}$ cm$^{-3}$ or less than $2 \cdot 10^{14}$ cm$^{-3}$.

10. The stacked III-V semiconductor diode according to claim 1, wherein the cathode layer and/or the anode layer has a dopant concentration of at least $1 \cdot 10^{17}$ cm$^{-3}$ or at least $5 \cdot 10^{18}$ cm$^{-3}$ or at least $8 \cdot 10^{18}$ cm$^{-3}$.

11. The stacked III-V semiconductor diode according to claim 1, wherein the cathode layer and/or the anode layer has a layer thickness of at least 2 μm or at least 5 μm or at least 20 μm.

12. The stacked III-V semiconductor diode according to claim 1, wherein the cathode layer has a first section with a constant dopant concentration curve and a second section arranged between the first section and the drift region with a dopant concentration curve ascending in a linear and/or concave and/or step-like manner in the direction of the first section.

13. The stacked III-V semiconductor diode according to claim 12 wherein the second section has a layer thickness of at least 0.5 μm and of a maximum of 10 μm of at least 2 μm and at most 4 μm.

14. The stacked III-V semiconductor diode according to claim 1, wherein the cathode layer or the anode layer is formed as a substrate.

15. The stacked Ill-V semiconductor diode according to claim 1, wherein the p-doped drift layer and/or the anode layer have isoelectric or isovalent centers to increase the switching speed.

* * * * *